(12) United States Patent
Figov

(10) Patent No.: US 6,579,660 B1
(45) Date of Patent: Jun. 17, 2003

(54) PROCESS FOR DIRECT DIGITAL PRINTING OF CIRCUIT BOARDS

(75) Inventor: Murray Figov, Raanana (IL)

(73) Assignee: Creo Il Ltd., Herzlia (IL)

( * ) Notice: Subject to any disclaimer, the term of this patent is extended or adjusted under 35 U.S.C. 154(b) by 0 days.

(21) Appl. No.: 09/890,156
(22) PCT Filed: Mar. 9, 2000
(86) PCT No.: PCT/IL00/00143
§ 371 (c)(1), (2), (4) Date: Jul. 27, 2001
(87) PCT Pub. No.: WO00/59717
PCT Pub. Date: Oct. 12, 2000

(30) Foreign Application Priority Data

Apr. 4, 1999 (IL) .................................................. 129307

(51) Int. Cl.⁷ .............................. B32B 9/00; G03C 5/56
(52) U.S. Cl. ..................... 430/273.1; 430/311; 430/944; 430/945; 430/318; 430/317; 428/209; 216/13; 216/65
(58) Field of Search ............................ 430/273.1, 311, 430/944, 945, 318, 317; 428/209; 216/13, 65

(56) References Cited

U.S. PATENT DOCUMENTS

| | | | |
|---|---|---|---|
| 4,132,168 A | 1/1979 | Peterson | 101/471 |
| 4,405,709 A | 9/1983 | Katano et al. | 430/307 |
| 4,717,639 A | 1/1988 | Dubin et al. | 430/124 |
| 5,262,275 A | 11/1993 | Fan | 430/273 |
| 5,270,368 A | 12/1993 | Lent et al. | 524/236 |
| 5,607,814 A | 3/1997 | Fan et al. | 430/258 |

FOREIGN PATENT DOCUMENTS

WO  WO97/27065  7/1997  ............ B41N/1/08

*Primary Examiner*—Mark F. Huff
*Assistant Examiner*—Daborah Chacko Davis (57) ABSTRACT

A blank printed circuit board (10), for creating a circuit pattern thereon by direct imaging with infrared radiation. The blank printed circuit board (10) includes in sequence an insulating substrate (20), a metal layer (21), a resist layer (22) and a mask layer (23). The resist layer (22) has been deposited from an organic solution, has a thickness of between 3 microns and 30 microns and includes three components: a first component, constituting 35% to 75% of the layer by weight and including acrylic monomers and oligomers, capable of polymerising when and where irradiated by ultraviolet radiation in the presence of photoinitiators, such polymerisation constituting curing of respective portions of the resist layer, a second component, constituting up to 10% of the layer by weight and including photoinitiators and synergists; and the third component, constituting 10% to 50% of the layer by weight and including binder resins that are soluble in water or in dilute aqueous alkali solvents, as well as nonalkali solvents. The mask layer (23) has been deposited from an aqueous suspension which has a thickness of between 0.3 microns and 6 microns, and includes between 80% and 100% by weight of carbon black and not more than 10% by weight of binder resins.

27 Claims, 8 Drawing Sheets

| Trade name | Description | Manufacturer or vendor |
|---|---|---|
| Alsynol RC12 | Rosin-maleic resin esterified with pentaerithritol | DSM 3150 AA Hoek van Holland |
| Ebecryl 1259 | Aliphatic trifuntional urethane acrylate diluted with 35% hydroxy propyl methacrylate | UCB Chemicals, Basle, Switzerland |
| Irgacure 184 | 1-hydroxy-cyclohexyl-phenyl-ketone | Ciba-Geigy Corporation, CH-4002, Basle, Switzerland |
| Cab-o-Sil M5 | Fumed silica | Cabot Corporation, Billerca, Massuchsetts, US |
| CAB-O-JET 200 | Aqueous dispersion of carbon black | Cabot Corporation, Billerca, Massuchsetts, US |
| Speedcure ITX | Isopropylthioxanthone | Lambson, Castleford, UK |
| Irgacure 907 | 2-Methyl-1[4-(methylthio)phenyl]-2-morpholino-propan-1-one | Ciba-Geigy Corporation, CH-4002, Basle, Switzerland |
| Sudan Black B | black dye | BDH Laboratories, Poole, Dorset, England |
| BYK 307 | Polyether modified polydimethyl siloxane | BYK-Gardner GmbH, Geretsried, Germany |
| Ebecryl 150 | Bisphenol A derivative of diacrylate oligomer | UCB Chemicals, Basle, Switzerland |
| Scripset 550 | Secondary butyl ester of styyrene-maleic anhydride copolymer | Solutia Europe NV/S.A. Louvain-La-Neuve(Sud), Belgium |
| Q2-5211 | Superwetting Agent | Dow Corp., Midland, MI, USA. |

PROCESS FOR DIRECT DIGITAL PRINTING OF CIRCUIT BOARDS

FIELD AND BACKGROUND OF THE INVENTION

The present invention relates to digitally producing patterns of copper wiring for printed circuit boards and, more particularly, to a process and materials for efficient imaging of etch resistant layers over the copper layer of a circuit board.

Printed circuit boards (PCBs) are built of an insulating substrate—for instance, glass filled epoxy or polyimide film—over which a thin conducting layer, usually of copper, in a pattern designed for any specific application, has been produced. The patterned conducting layer (also referred to as a printed circuit), is the means of carrying electrical voltages and currents between various electrical components, such as resistors, capacitors, integrated circuits and other electronic devices. The electrical components are soldered onto the copper printed circuit 'wires' at a stage after the formation of the printed circuit.

According to conventional methods, the process of printing a specific circuit onto a PCB begins with a blank board, consisting of an insulating substrate and a copper layer (formed either by electrodeposition or as a rolled foil laminate. A photosensitive resist (photoresist) layer (whose function is described below) is spread over the copper—either by depositing it from solution or by providing it as a dry film and bonding it to the copper by pressure sensitive adhesive. A sheet of intermediate photographic film (known as a phototool) that contains a negative image of the circuit pattern is then superimposed on the photosensitive resist layer in close contact and this combination is exposed to a flood of ultra-violet (UV) light. Ultra-violet light transmitted through the transparent areas of the recording film (which correspond to prospective conducting portions of the circuit) causes the photosensitive layer under them to harden (i.e. polymerize). The unhardened material is then washed away with a suitable solvent, baring the underlying copper in the areas that were protected from the UV light. The board is then placed in an etch bath, where the bare copper is etched away, while portions of the copper layer that lie under the remaining resist layer are protected from the etching action. Finally, the remaining (hardened) photoresist is removed with a suitable solvent.

Since nowadays the circuit pattern (i.e. wiring configuration) is produced digitally on a computer, the aforementioned phototool (intermediate film) is usually produced by laser recording the image on the film from the digital data, using an imagesetter. The process of thus producing the phototool involves several steps, including chemical processing of the film. It is, therefore, costly, in terms of both labor and materials. It would thus be economically advantageous if the image data could be transferred directly from the computer onto the circuit board, circumventing the entire process of producing the phototool. The elimination of the intermediate film, with its chemical processing, would also have environmental advantages.

Various attempts have been made to digitally print PCBs directly. U.S. Pat. No. 5,270,368 describes a method for image-wise applying an etch-resistant material onto the copper layer, using ink-jet techniques. It discloses resist compositions suitable for jetting, which consist of a mixture of at least two acrylates plus a photoinitiator plus an organic carrier (solvent). The viscosity of the composition is from about 1 to 10 centipoise. Upon jetting the material onto the copper layer, the solvent evaporates and the resist is set; it is then hardened by exposing it to a flood of UV light for curing. The main disadvantage of the jetting method is its limited spatial resolution; the wiring of modern PCBs contains features measured in tens of microns—which is beyond the practical capabilities of ink-jet techniques because of inaccuracy of dot placement and difficulty in producing very small dots.

U.S. Pat. No. 4,717,639 describes a method for image-wise applying an etch-resistant material onto the copper layer, using electrophotographic techniques, akin to xerography. It discloses a specially formulated toner powder, which is printed onto the copper and which, following the etching stage, is removed with strong alkali. This method, as well, places limitations on the achievable resolution because of the limitation on the smallest toner particles to be used.

Rather than directly printing a resist pattern onto the copper, an alternative approach, which inherently yields much higher resolution, is to coat the copper layer with a photoresist (as in the conventional process) and to form thereon a mask, which is opaque to the UV light that subsequently floods the photoresist to harden it. Methods and processes for forming a UV-opaque mask by digital writing are known in the realm of direct digital production of printing forms for printing presses. U.S. Pat. No. 4,132,168 describes a laser ablated masking for an offset-lithographic plate. The plate consists of a conventional aluminum substrate, coated with a conventional UV sensitive layer and over that—a layer opaque to UV (which is deposited either from vacuum or from solvent). The latter is selectively removed by ablation, using a laser beam. The non-removed opaque material then acts as a mask for the UV exposure of the underlying sensitive layer. The mask is then removed and subsequently the plate is processed to remove the non-exposed sensitive layer, thus forming a lithographic image. The process disclosed in the '168 patent is not suitable for PCB production, since the photosensitive layer cannot act as an etch-resist and, moreover, generally has a thickness of the order of 1 micron or less.

U.S. Pat. No. 5,607,814 describes a masking method for producing a flexographic printing form (or plate) that uses a transfer process. The plate consists of a substrate and a thick photosensitive layer, which contains photoinitiators. A cover sheet, coated with at least one infrared (IR) sensitive layer, is placed over the plate and exposed to an IR image. The IR exposed areas transfer onto the UV sensitive layer and subsequently act as a mask while the layer is flooded by UV light. The unmasked areas of the layer polymerise (to eventually become the printing surfaces) and the remaining (unpolymerised) material, as well as the mask, is subsequently removed. The process disclosed in the '814 patent is, again, not suitable for PCB production, since the photosensitive layer is much too thick and consists of elastomeric material, which is not inherently etch resistant. Moreover, the photosensitive elastomeric layer, which serves as the printing form, is necessarily designed to be sturdy and durable, whereas the photosensitive resist layer of a PCB must be easily removable after the etching process.

U.S. Pat. No. 5,262,275 also describes a UV masking method for producing a flexographic printing plate, but here the mask is formed of a layer of infrared ablatable material. The patent discloses a barrier layer between the IR and the UV layer, to prevent migration of materials from the UV layer into the IR layer and to prevent oxygen inhibition of the UV curing process. This method is not suitable for PCB production, for the reason given above, with respect to the '168 and '814 patents, and because it uses a strong solvent, such as methylene chloride, to remove the mask, which solvent may attack the UV sensitive layer if it were as thin as required in the PCB etching process.

There is thus a widely recognized need for, and it would be highly advantageous to have, a method and a process for digitally forming a UV-opaque mask directly over an etch-resistant photosensitive layer, usable in the course of PCB production, which permit each layer to function without chemical interaction therebetween.

SUMMARY OF THE INVENTION

The present invention successfully addresses the shortcomings of the presently known configurations by providing a blank printed circuit board (PCB) with only two coatings over the metal layer, which have improved properties that enable writing the wiring pattern on such a PCB with an image of infra-red (IR) radiation, by image-wise ablating a mask coating, subsequently irradiating an underlying photosensitive resist coating by ultra-violet (UV) radiation, modulated by the mask, and etching the metal while protected by the patterned resist.

The present invention discloses a novel composition of both the resist coating and the mask coating which simplify the process and make it more consistent and reliable.

More specifically, the blank PCB of the present invention consists of a conventional insulating substrate, such as glass-filled epoxy, laminated to a copper foil, on top of which is a resist layer, which is coated with a mask layer. The resist layer consists of three components: (a) a group of oligomers and monomers that polymerize under UV irradiation, in the presence of photoinitiators, (b) photoinitiators and synergists that generate free radicals for cross linking the resins of component 'a', and (c) binder resins. The mixture of the three components is deposited on the copper out of an organic-solvent solution, to form a 12 microns thick film. Component 'a' forms 35%–75%, component 'b'—less than 10% and component 'c'—10%–50% of the film, by weight. The mask layer consists primarily of carbon black—up to 100%, which is deposited out of an aqueous suspension, to form a coating whose thickness is in the order of 1 micron.

The resist layer has the basic property of becoming cured when component 'a' polymerizes, making it insoluble in water (or dilute aqueous alkali solution) and resistant to metal etching agents, used for etching the underlying metal foil. The binder resins (component 'c') and their proportion are chosen to be soluble both in water (or dilute aqueous alkali solution) and in organic solvents and to have the essential properties of (1) adsorbing to the surface of the resist layer some of the carbon black from its aqueous suspension and thus rendering the deposited mask layer rub resistant and (2) while remaining water soluble in the uncured state, allowing the polymerised component 'a', in the cured state, to remain water resistant. Aqueous solubility in the uncured state preferably extends also to etching solutions, so that the washing and etching can proceed as a combined process. The adsorption property (1) is of such nature that it does not interfere with ablation of the mask layer (as described herebelow).

Carbon black has been chosen for the mask layer because (1) it absorbs IR well and (2) it greatly attenuates UV radiation, by absorption, and thus masks it from the underlying resist layer during the curing process. The layer's thickness has been chosen to optimize both these functions. Aqueous suspension is specified, because an organic solvent may cause some carbon black to diffuse into the resist layer, thus evading ablation, and, on the other hand, it is not necessary for rendering the coating rub resistant, because of the binder resin in the resist layer, as explained hereabove. For the same reason, the mask layer itself also does not need to contain binder resins, thus allowing a greater density of carbon black and hence—greater sensitivity to IR.

During production of a PCB with a specific wiring pattern, the blank PCB, which is composed as described hereabove, is first irradiated by scanning beams of high-power-density IR radiation, e.g. from diode lasers, switched on/off according to digitally stored data representing the desired wiring pattern. Irradiated portions of the mask are ablated, leaving underlying portions of the resist exposed. These are subsequently irradiated by a UV flood (while masked portions remain protected) and are consequently cured. The PCB is then washed with water or alkaline solution, which removes all remaining mask portions and uncured resist, baring the underlying copper portions. Thereafter (or concurrently) the PCB is immersed in an etching solution, which etches away the bared copper. Finally the PCB is wiped with an organic solution, to remove all remaining (cured) portions of the resist, leaving the underlying patterned copper.

According to the present invention there is provided a blank printed circuit board (PCB), for creating a circuit pattern thereon by direct imaging with infra-red radiation, comprising in sequence an insulating substrate, a metal layer, a resist layer and a mask layer, wherein:

The resist layer has been deposited from an organic solution, has a thickness of between 3 microns and 30 microns and includes three components a first component, constituting 35% to 75% of the layer by weight and including acrylic monomers and oligomers, capable of polymerising when and where irradiated by ultra-violet radiation in the presence of photoinitiators, such polymerisation constituting curing of respective portions of the resist layer, a second component, constituting up to 10% of the layer by weight and including photoinitiators and synergists, and a third component, constituting 10% to 50% of the layer by weight and including binder resins that are soluble in water or in dilute aqueous alkali solvents, as well as in non aqueous solvents; and The mask layer has been deposited from an aqueous suspension, has a thickness of between 0.3 microns and 6 microns, and includes between 80% and 100% by weight of carbon black and not more than 10% by weight of binder resins.

According to further features in preferred embodiments of the invention described below, the mask layer is ablatable by infra-red irradiation and directly adjoins the resist layer, uncured portions of the resist layer are entirely soluble in water or in dilute aqueous alkali solvents, the resist layer has the further property of adsorbing carbon black from aqueous suspensions so as to render the mask layer rub resistant, and binder resins have the further property of not preventing cured portions of the resist layer from being resistant to aqueous alkali solvents.

According to still further features in the described preferred embodiments, the resist layer, where not cured, is also soluble in metal etching agents, has the further properties of thermally insulating between the metal foil and the mask layer and of not allowing diffusion thereto of carbon black from the mask layer in quantities that would interfere with the polymerisation.

According to another aspect of the invention there is provided a method for fabricating a blank PCB that is amenable to creating a circuit pattern thereon by direct imaging with infra-red radiation, such as specified hereabove.

According to yet another aspect of the invention there is provided a method for fabricating a printed circuit board (PCB) with a wiring pattern formed thereon according to digitally provided image data, comprising:

(a) Providing a blank PCB that includes four layers, the four layers being, in sequence, an insulating substrate, a metal foil, a resist layer and a mask layer, wherein the resist (IR) radiation;

(b) Exposing the mask layer to IR radiation whose intensity varies over the upper surface of the mask layer between a low value and a high value according to the image data, the high value being such as to cause ablation of the mask layer;

(c) Exposing the resist layer to a flood of UV radiation, such that causes the resist layer to cure under all areas that correspond to portions of the mask layer that have been ablated, whereby all portions of the resist layer that lie under unablated portions of the mask layer remain uncured;

(d) Washing away all unablated portions of the mask layer and all uncured portions of the resist layer, so as to bare the upper surface of the metal layer in essentially all areas that correspond to uncured portions of the resist layer;

(e) Subjecting the PCB to a metal etching agent such that etches the metal layer away under all areas that have been bared in step d, whereby essentially all portions of the metal layer that lie under cured portions of the resist layer remain intact;

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method for directly printing circuit patterns on printed circuit boards.

Specifically, the present invention can be used to digitally form a patterned mask, by infra-red (IR) imaging, which masks ultra-violet (UV) light subsequently projected onto an underlying photoresist layer, in order to form a pattern of hardened resist that protects the underlying copper layer during the etching process. The present invention can also be used to fabricate a pre-sensitized circuit board blank suitable for such a pattern forming method.

The principles and operation of producing printed circuit boards according to the present invention may be better understood with reference to the drawings and the accompanying description.

Figure 1:
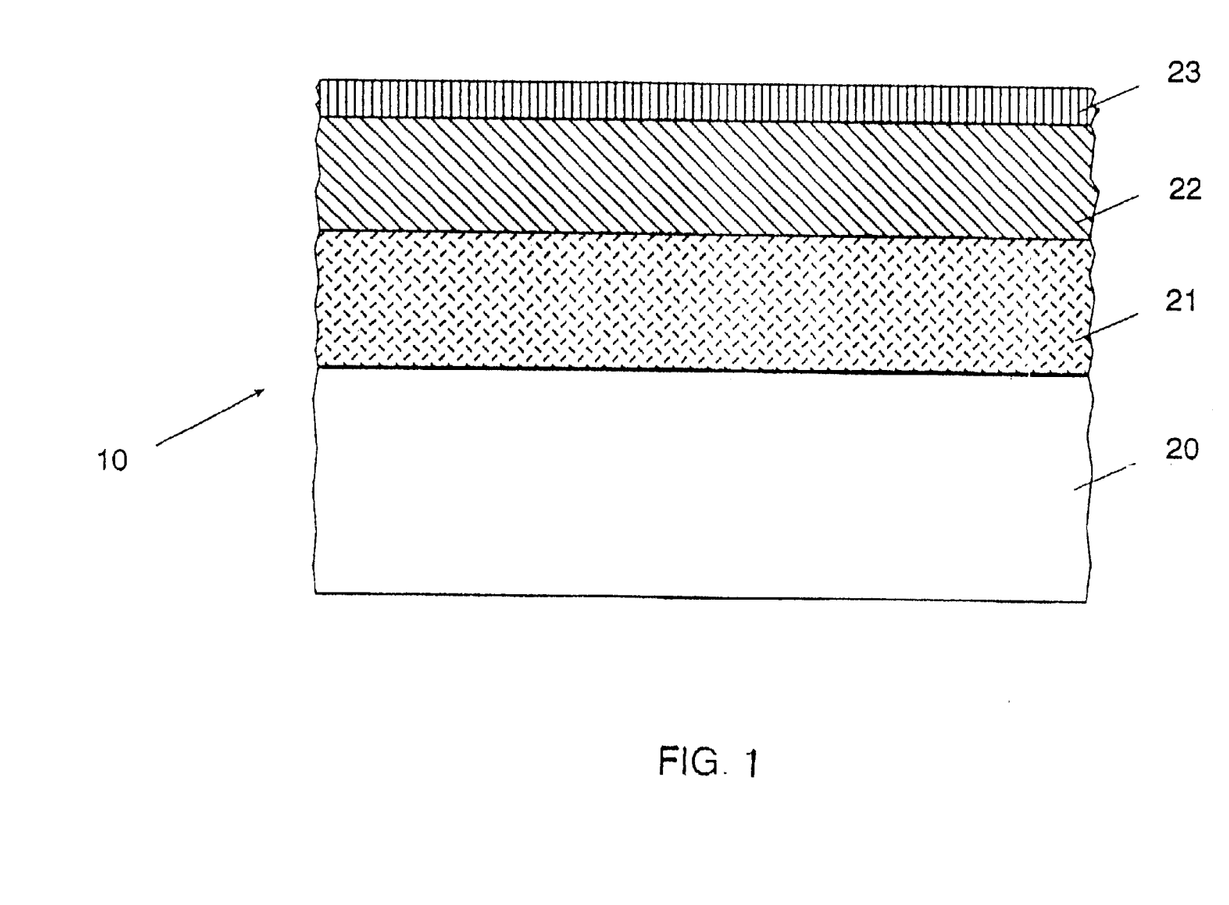
FIG. 1 is a cross-sectional drawing of a portion of a blank printed circuit board according to the present invention.

Referring now to the drawings, FIG. 1 illustrates the structure of a PCB 10 according to a preferred embodiment of the invention. It consists of an insulating substrate 20, onto which is laminated a copper cladding 21. Over copper cladding 21 are coated, in sequence, layers 22 and 23. Substrate 20 can be polyimide film, glass filled epoxy or phenol-formaldehyde or any other insulating materials known and used in the industry, and of any thickness deemed useful to the industry. Similarly, copper cladding 21 is well known to the art and is supplied laminated to the substrate in required thicknesses. It will be appreciated that claddings made of other metals may also be used, if deemed preferable, and that the present invention is then equally applicable.

Layer 22, which is deposited onto the copper, functions both as a photoresist (which is its main purpose) and as a thermal insulator during the ablation process, to be described herebelow. The latter function is important because if such thermal insulation were absent, it would require much more energy to form an ablatively imaged pattern, since the copper would conduct away part of the heat generated by the infra-red laser during the ablation process. Layer 22 is composed of the following three components:

Component 'a'—between 35% and 75% by weight: UV-curable resins, i.e. oligomers and monomers that can be cross-linked, in the presence of a photoinitiator, by means of irradiation with ultra violet light.

Component 'b'—up to 10% of the weight of component 'a': Photoinitiators and synergists that will generate and promote free radicals needed for the cross-linking reaction of component 'a'.

Component 'c'—from 10% to 50% by weight: Binder resins that must be soluble in water or dilute alkali, as well as in non-aqueous (organic) solvents. Due to the presence of the binder resin, the uncured film has the property that it adsorbs aqueous suspensions of carbon black from layer 23 into its surface and thus renders the deposited layer 23 rub resistant. At the same time, the binder resin, in the specified range of proportion, does not permit excessive diffusion of the carbon black into layer 22, which otherwise could adversely affect the overall IR sensitivity of the system, by allowing the diffused carbon black to evade ablation and subsequently partially mask UV radiation, thus interfering with the UV curing process.

In addition, there are optional ingredients, such as fillers and wetting agents, as well as dyes or pigments to aid visual examination of the layer. The entire mixture is deposited onto the copper cladding 21 as a coating from a non-aqueous solvent. Coating thickness preferably is 12 microns, but can be between 3 microns and 30 microns, in order to obtain maximal difference in solubility between cured and uncured regions and optimal adhesion properties.

The three components of layer 22 preferably consist of materials showing suitable duality of solubility in both aqueous and non-aqueous solvents. This would exclude resins such as polyvinyl chlorides, which may be soluble in organic solvents but not in water, and polyvinyl alcohols, which are not soluble in non-aqueous solvents. The resin system used for component 'c' must be soluble in organic solvents, so that the monomers and oligomers of component 'a', as well as the photoinitiators of component 'b', will dissolve easily and, upon application, will yield a compatible dry film. The resins must also have aqueous solubility so that the uncured layer can be washed away, as described below. Although it would be possible to make a system where the layer is washed away with an organic solvent, this is environmentally not desirable. In addition, the resin system is preferably also soluble in etching agents, such as aqueous ferric chloride solution; this has the advantage of simplifying the PCB preparation process, as described below. Examples of types of resins that are useful in the system are Novalaks (functionally substituted phenol-formaldehyde resins), styrene maleic anhydride copolymers, polyvinyl methyl ether/ maleic anhydride copolymer and its esters, hydroxy propyl cellulose and esterified rosin-maleic esters.

Layer 23, which, after image-wise ablation, acts as a mask during UV exposure—all as described herebelow, is coated on top of layer 22. The solvent used is preferably water. It is not desirable to use an organic-solvent-based top layer because such an organic solvent may attack the film of layer 22. Although some small amount of solvent penetration from layer 23 to layer 22 is expected, considerable solvent attack of layer 22, as would occur with an organic solvent for layer 23, is likely to cause some carbon black from Layer 23 to diffuse into layer 22, in spite of the correct binder resin therein, and thus, again, reduce IR sensitivity and interfere with the UV curing process, as explained hereabove. It is noted that thus it is not necessary to place a barrier layer between layer 22 and 23, as is the practice in some prior art, in order to prevent such interlayer diffusion. Layer 23 is also required to be amenable to being washed away by an aqueous solution after the ablation and UV exposure stages, as described herebelow.

The main and necessary ingredient of layer 23 is carbon black. This layer also contains a surface-active agent and, preferably, UV absorbing dyes or pigments, to enhance masking performance. Although water soluble binders may also be present, it is preferable, for the sake of maximizing sensitivity to IR, to either include just a small amount of an emulsion that contains a binder or to omit binders from this layer altogether. It is noted that layer 23 need contain only a small proportion of binder material—up to 10% at most, if any at all—because the presence of suitable binders in layer 22 assures adherance and rub resistance of deposited layer 23, as explained hereabove. The total thickness of this layer can be anywhere between 0.3 microns and 6 microns.

Figure 2A:
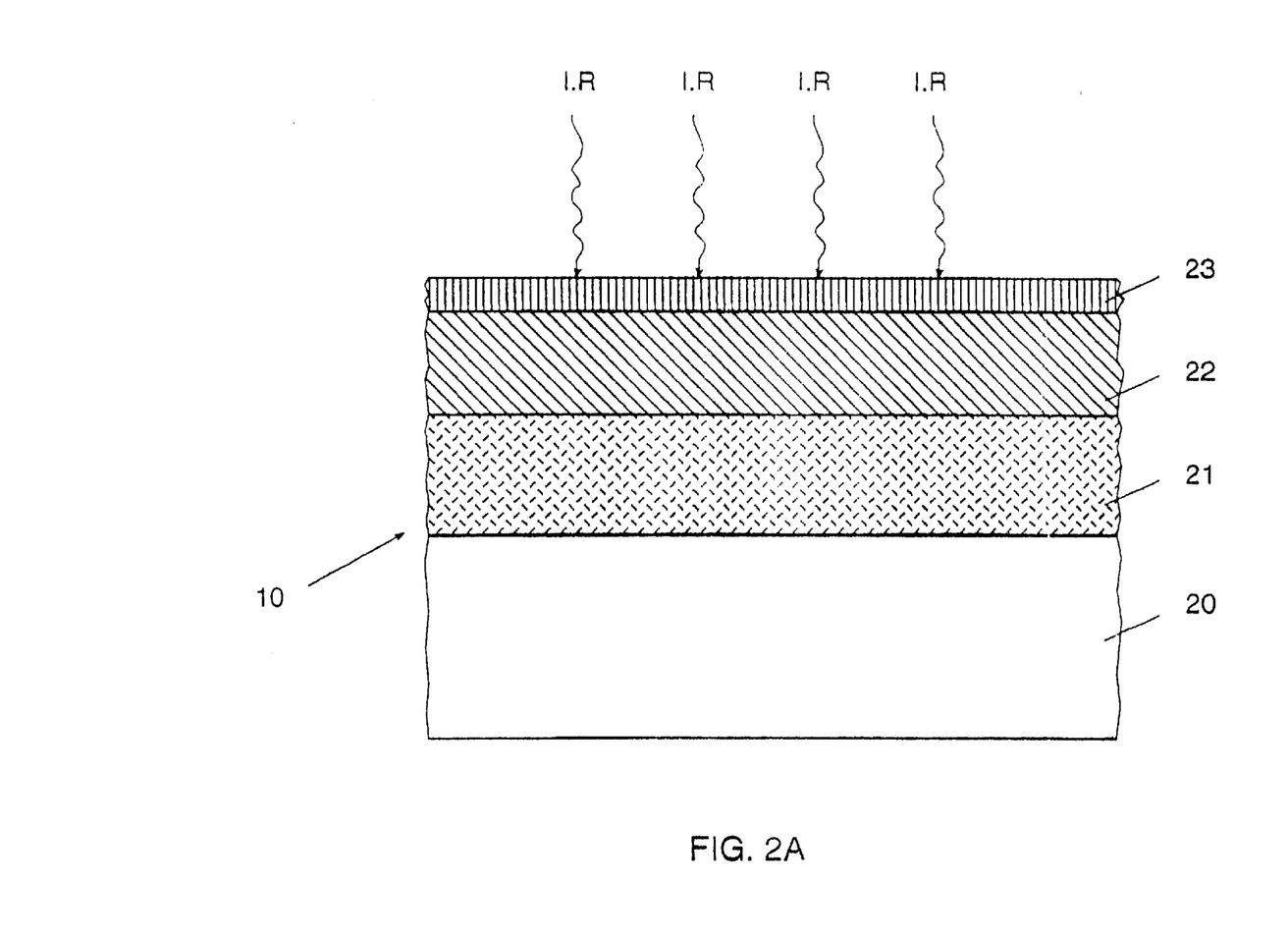
FIGS. 2A through 2F are cross-sectional drawings similar to that of FIG. 1, illustrating the effects of various stages in the process of creating the patterned wiring on the board.
Figure 2B:
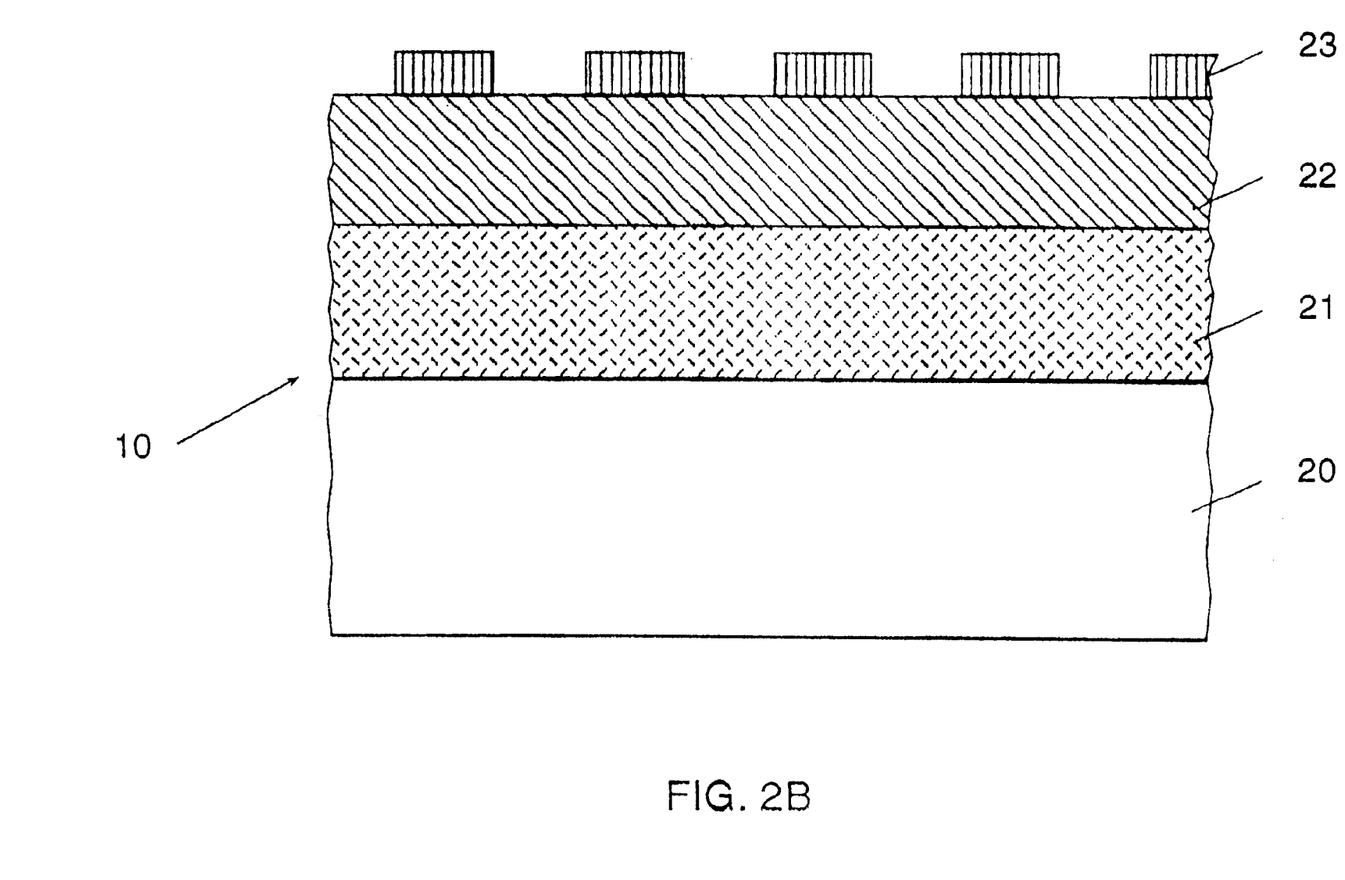

The process of creating a copper pattern on the PCB blank, constructed as described hereabove, will now be described with reference to FIGS. 2A–2F. FIG. 2A depicts the first stage in the process. Blank PCB 10 as described above is exposed to a pattern of infrared (IR) radiation, using any suitable IR imaging system. One such system, for example, is described in PCT Application PCT/IL97/00525 (Publication No. WO 97/27065) to the present Applicant and incorporated herein by reference. It comprises an array of infra-red diode lasers, which are modulated according to digital image data corresponding to the desired circuit board wiring, and an optical imaging and scanning system, which projects the output radiation of the lasers onto the face of Blank PCB 10. The modulation is such that areas corresponding to wiring (i.e. which eventually remain with the copper cladding intact) are irradiated at maximum power level, while areas to be devoid of copper are irradiated at very low power level or not at all. During exposure, layer 23 is ablated in the areas exposed to the radiation. It may then need further wiping with a dry cloth to remove any debris. A preferable alternative is to remove the debris by means of a vacuum system. FIG. 2B shows blank 10 with imaged areas of coating 23 ablated away. The remaining, unablated areas subsequently act as a mask, as explained below.

Figure 2C:
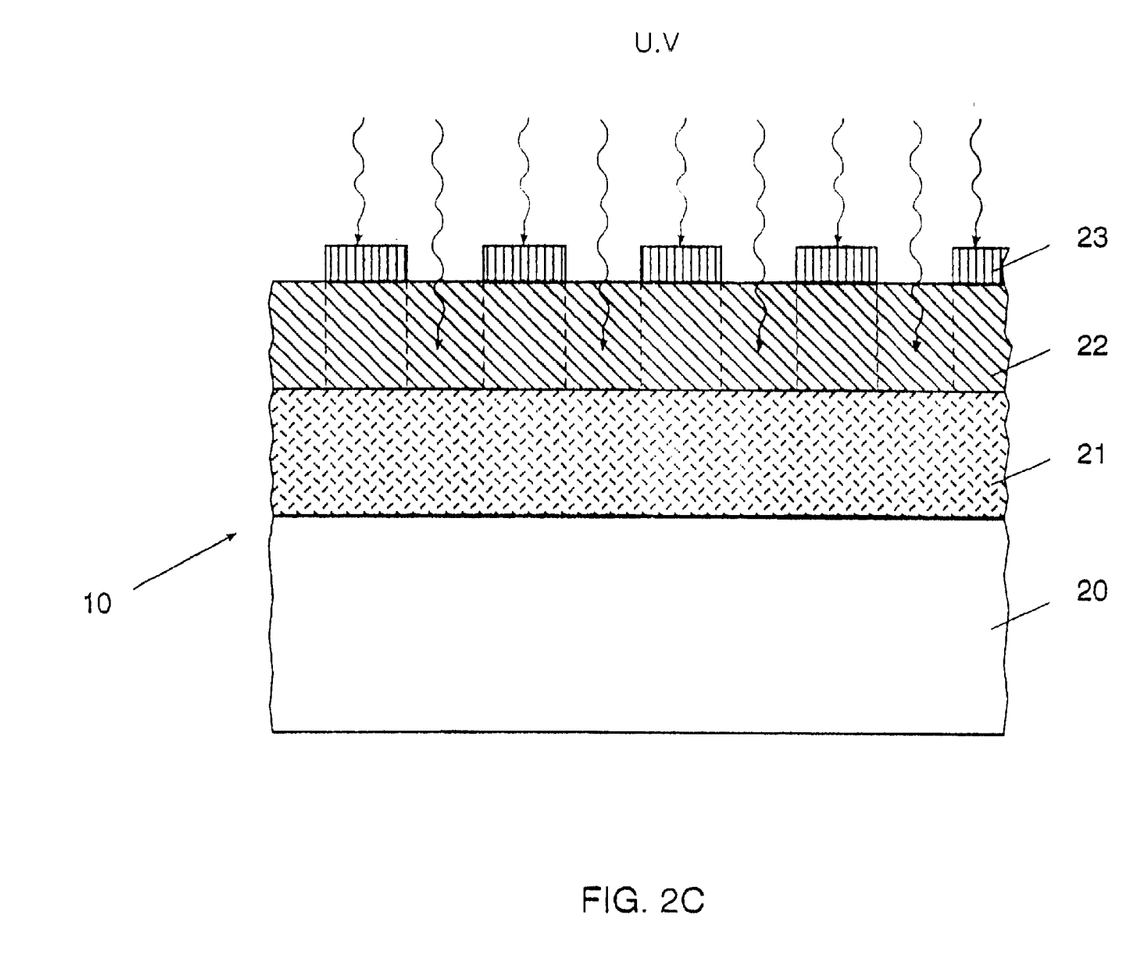

FIG. 2C shows exposure of the previously ablated PCB to flood irradiation by ultra violet (UV) light during the second stage of the process. This irradiation selectively cures (i.e. hardens) layer 22, by polimerising component 'a' (i.e. causing the oligomers and monomers therein to cross-link), in all of its portions that are not covered by layer 23, i.e., those which are under portions of layer 23 that have been exposed to IR and ablated during the first stage. In the other areas, the remaining portions of layer 23 absorb the UV radiation and prevent it from reaching layer 22, thus acting as a mask. It is noted that the energy density applied by this UV radiation is substantially lower than that previously applied by the IR radiation and thus no further ablation of layer 23 takes place.

Figure 2D:
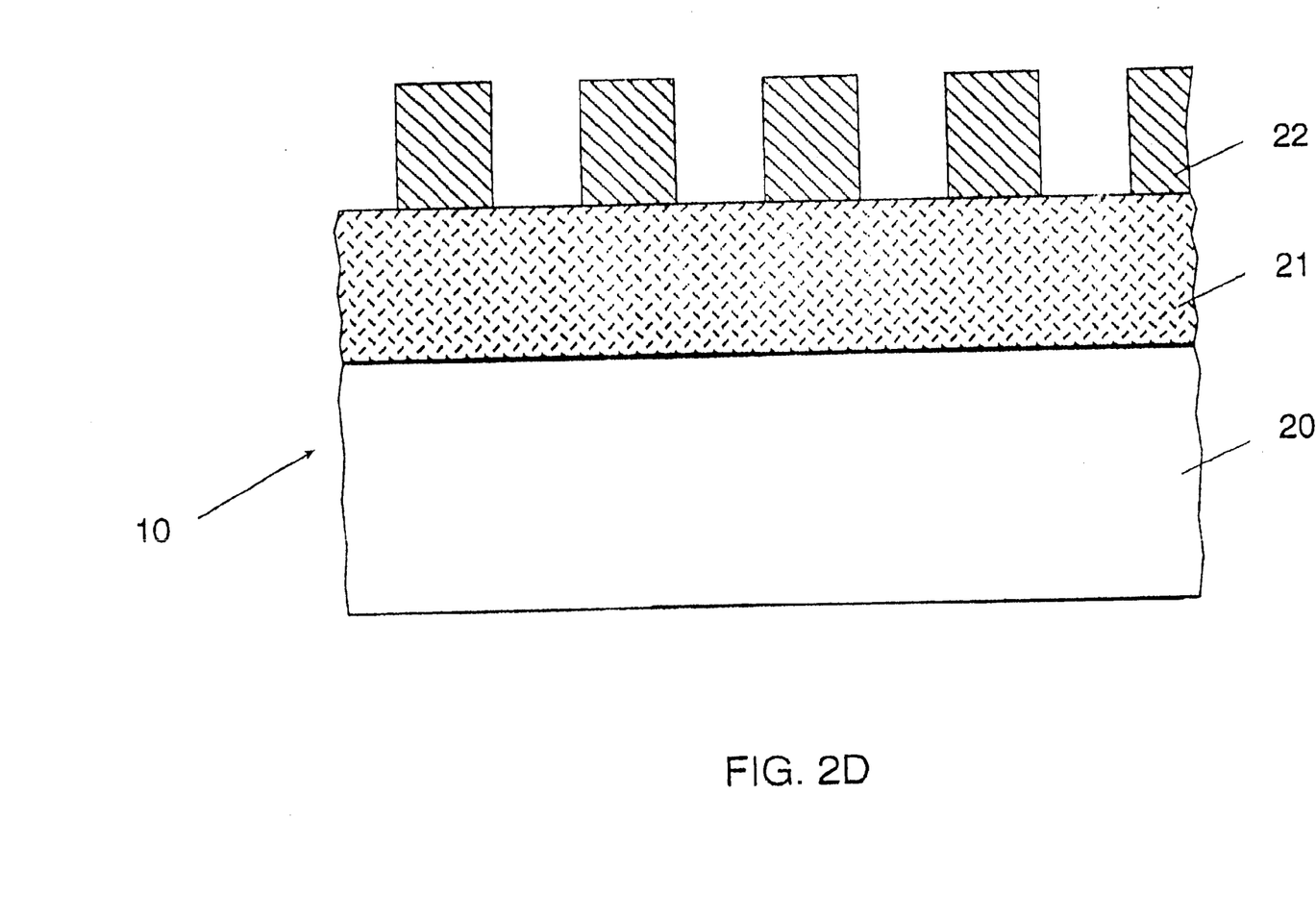

In the third stage of the process, PCB 10 is washed with an aqueous solution of, for example, sodium carbonate or sodium hydroxide. This solution dissolves, and thus removes, the remaining portions of layer 23 and also the portions of layer 22 lying directly under them (which portions remained uncured during the UV exposure of stage 2). FIG. 2D shows the PCB at the end of stage 3, after washing. It is noted that at this time, copper layer 21 is laid bare under all the areas not irradiated by IR during the first stage.

Figure 2E:
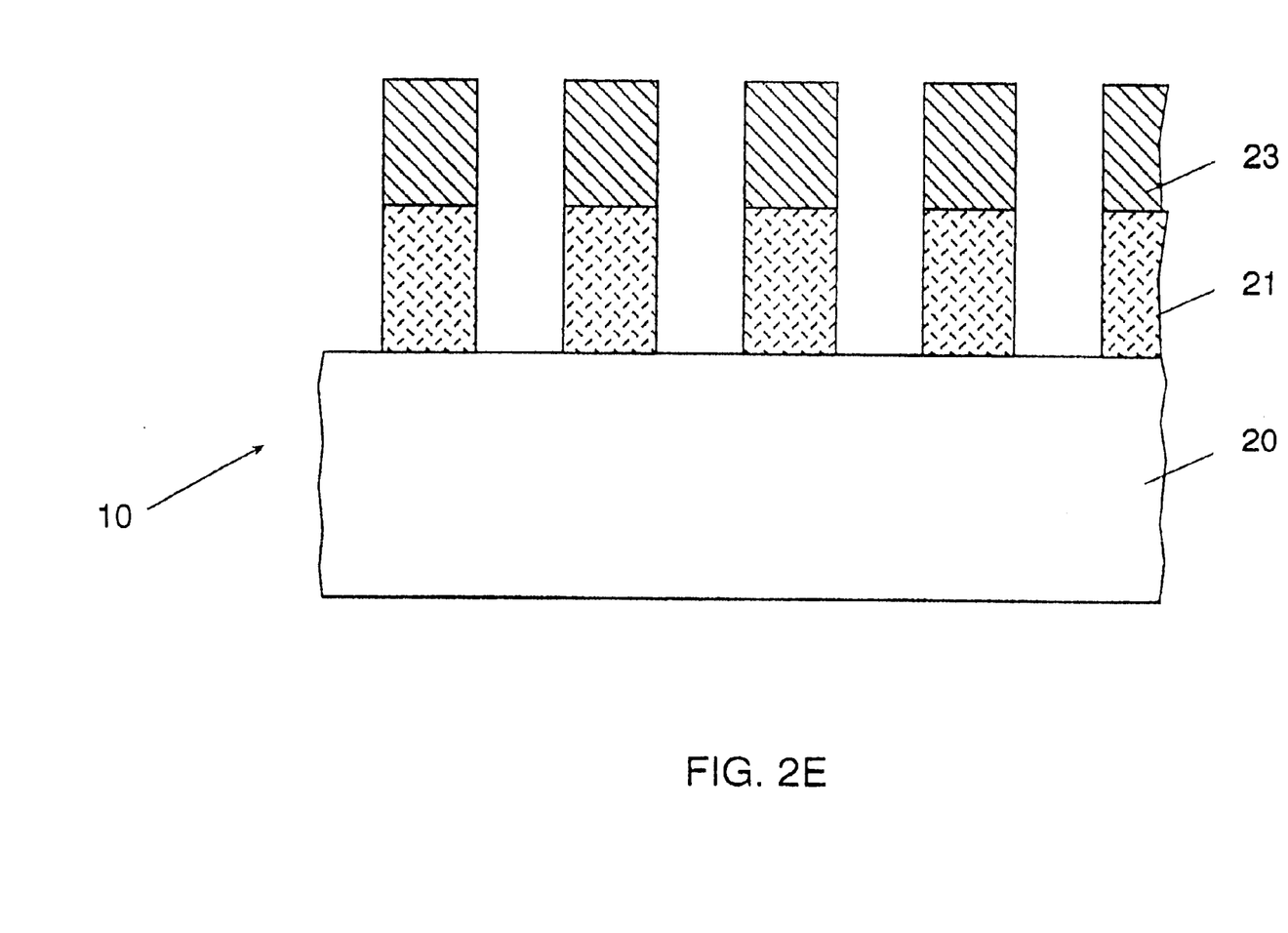

In the fourth stage, PCB 10 is immersed in a copper etching solution, which may be any known in the art; for example, a 30% solution of ferric chloride in water can be used. The solution etches and removes copper layer 21 in all areas not covered by the cured portions of layer 22, that is—in the areas that originally were not exposed to the IR radiation. FIG. 2E depicts the PCB at the end of the copper etching, showing layers 21 and 22 remaining in the areas intended for wiring.

It is noted that if the materials of layers 23 and also the materials of layer 22 in their unhardened state are made so as to be soluble in the etch solution, the third stage (washing) may be unnecessary and may be omitted.

Figure 2F:
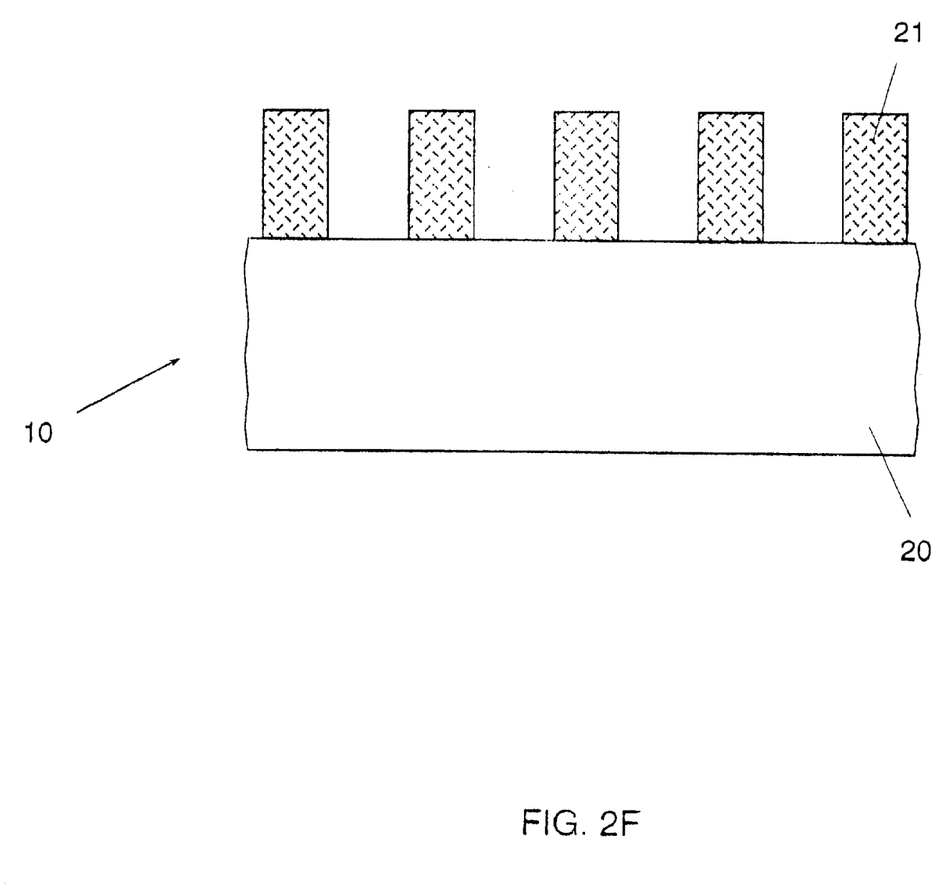

During the fifth and final stage of the process, the remaining (cured) portions of layer 22 are removed by means of an organic solvent, which may possibly be contained in an aqueous solution. This solvent does not necessarily dissolve the entire remaining layer, but may just be active enough to penetrate underneath the layer and to thus destroy its adhesion to the underlying copper layer, whereupon layer 22 is just swept away. The resultant state is depicted in FIG. 2F, which shows the patterned copper wiring portions of layer 21 remaining on top of insulating substrate 20.

The procedure followed in the laboratory for fabricating blank PCB 10 according to the present invention will now be described by way of example. It begins with a raw blank PCB, available commercially and typically consisting of a cladding of 18 micron thick copper laminated over a 100 micron thick substrate foil 20, which is made of glass-filled epoxy.

To form photoresist layer 22, the following composition was first made up (parts by weight) and milled in a ball mill for 2 hours:

| | |
|---|---|
| Methyl Ethyl Ketone | 205 parts |
| Kaolin | 34 parts |
| Ebecryl 150 | 20 parts |
| Cab-O-Sil M5 | 8.6 parts |

After the milling, the following ingredients (all parts by weight) were stirred into the composition, one by one:

| | |
|---|---|
| Scripset 550 | 21 parts |
| Ebecryl 1259 | 110 parts |
| Alsynol RC 12 | 25 parts |
| Irgacure 184 | 2.8 parts |
| Irgacure 907 | 4.3 parts |
| Speedcure ITX | 1.14 parts |
| BYK 307 | 1.32 parts |
| Sudan Black B | 0.17 parts |

This composition was bar coated over the copper layer (layer 21) of the raw blank PCB to form a dry-weight thickness of 12 microns after evaporation of the solvent (Methyl Ethyl Ketone) at 140° C. for 2 minutes.

To form mask layer 23, the following composition was made up:

| | |
|---|---|
| Cab-O-Jet 200 carbon black dispersion | 35.2 parts |
| Water | 10.5 parts |
| Q2-5211 Superwetting Agent. | 2.2 parts |

This composition was bar coated on top of layer 22 to a dry weight of 0.8 grams per square meter and air dried. The coating penetrated layer 22 just sufficiently to be bound into the surface of the coating. In view of the absence of a binder in layer 23, this adhesion effect is thought to be due to the hydrophilic properties of the non-photosensitive binder resin in layer 22.

Figure 3:
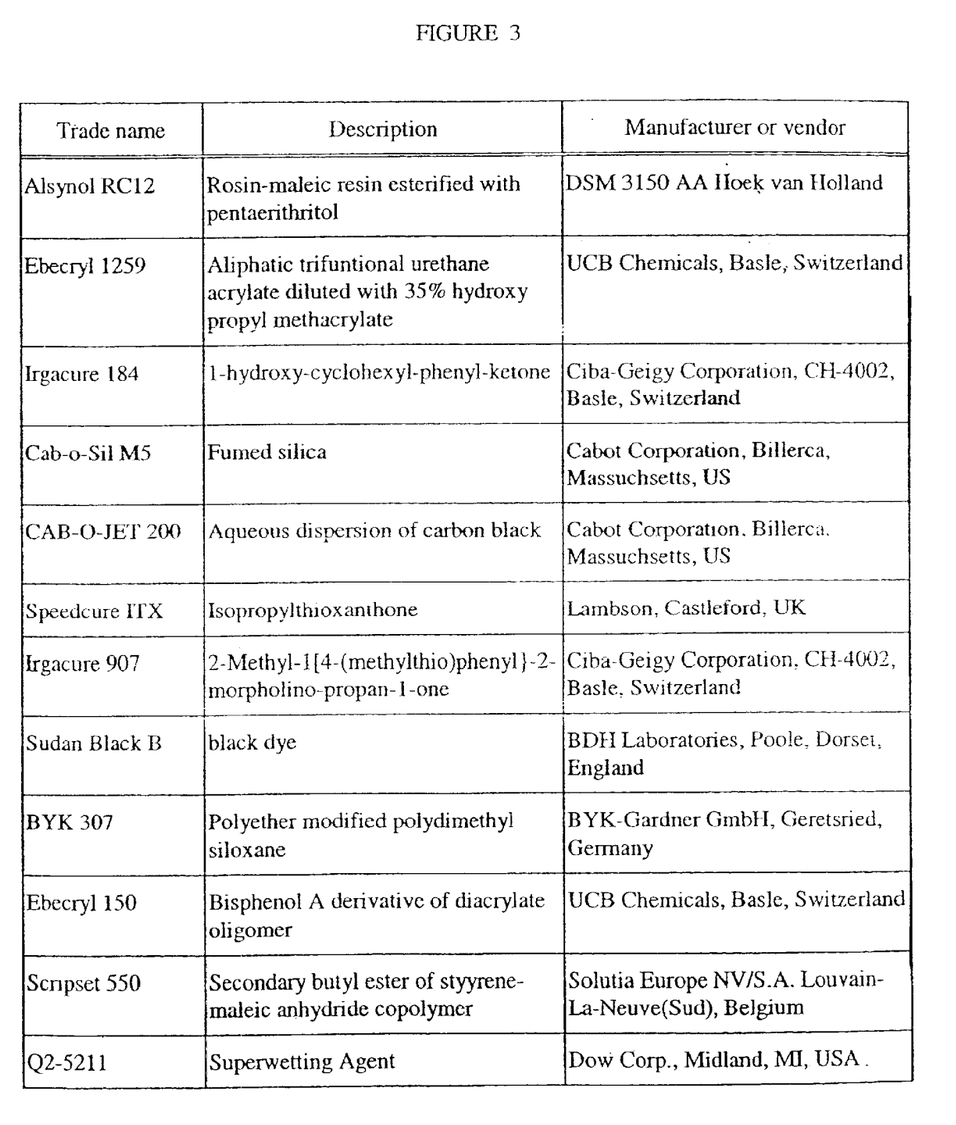
FIG. 3 is a table listing and explaining the trade-named materials used in the preferred embodiment of the invention.

This finished the fabrication of a laboratory model of a blank PCB according to the present invention. The trade-named materials mentioned hereabove are further described in the table of FIG. 3.

The laboratory-fabricated blank PCB was subsequently formed into an exemplary specific PCB by the following procedure:

The blank PCB was mounted on the drum of a plate writing apparatus, such as model Lotem 800V, manufactured by Scitex Corporation, Herzlia, Israel.

Then, with the drum rotating, the blank was exposed to image-wise modulated IR radiation, having maximum intensity of 500 mJ/cm$^2$ and emanating from a laser diode array constructed according to the teaching of PCT/IL97/00525.

The blank was then removed from the drum and flood-exposed to a UV source. The UV source consisted of an elongated high-pressure mercury vapor lamp, radiating at a power of 300 watts per inch of length and placed across, 5 cm from the blank. During exposure, the blank moved past the lamp at a speed of 25 feet per minute.

After exposure, the blank was gently washed with 0.1% solution of sodium hydroxide and then—with water.

Thereafter it was etched for 20 minutes in a 30% ferric chloride solution held at 60° C.

The board was then washed with water and rubbed with methyl ethyl ketone, to remove the remainder of the resist layer. This yielded a finished circuit board.

While the invention has been described with respect to a limited number of embodiments and formulations, it will be appreciated that many variations, modifications and other applications of the invention may be made.

I claim:

1. A blank printed circuit board (PCB), for creating a circuit pattern thereon by direct imaging with infrared radiation, comprising in sequence an insulating substrate, a metal layer, a resist layer and a mask layer, wherein:

the resist layer has been deposited from an organic solution, has a thickness of between 3 microns and 30 microns and includes three components a first component, constituting 35% to 75% of the resist layer by weight and including acrylic monomers and oligomers, capable of polymerising when and where irradiated by ultraviolet radiation in the presence of photoinitiators, such polymerisation constituting curing of respective portions of the resist layer, a second component, constituting up to 10% of the resist layer by weight and including photoinitiators and synergists, and a third component, constituting 10% to 50% of the resist layer by weight and including binder resins that are soluble in water or in dilute aqueous alkali solvents, as well as in non aqueous solvents;

the mask layer has been deposited from an aqueous suspension, has a thickness of between 0.3 microns and 6 microns, and includes between 80% and 100% by weight of carbon black and not more than 10% by weight of binder resins.

2. The blank PCB of claim 1, wherein uncured portions of said resist layer are entirely soluble in water or in dilute aqueous alkali solvents.

3. The blank PCB of claim 1, wherein said binder resins have a further property of not preventing cured portions of said resist layer from being resistant to aqueous alkali solvents.

4. The blank PCB of claim 1, wherein said resist layer has a further property of adsorbing carbon black from aqueous suspensions so as to render said mask layer, formed thereon, rub resistant.

5. The blank PCB of claim 1, wherein said resist layer, where cured, is resistant to metal etching agents.

6. The blank PCB of claim 5, wherein said resist layer, where not cured, is also soluble in metal etching agents.

7. The blank PCB of claim 1, wherein said mask layer directly adjoins said resist layer.

8. The blank PCB of claim 1, wherein said resist layer has a further property of thermally insulating between said metal foil and said mask layer.

9. The blank PCB of claim 1, wherein said mask layer has a property of substantially attenuating ultraviolet radiation and is ablatable by infrared irradiation.

10. The blank PCB of claim 9, wherein said resist layer has a further property of not allowing diffusion thereto of carbon black from said mask layer in quantities that would interfere with said polymerisation.

11. A method for preparing a blank printed circuit board that is amenable to creating a circuit pattern thereon by direct imaging with infrared radiation, comprising:

(a) providing an insulating substrate, laminated with a metal foil;

(b) depositing over said metal foil an organic solution of
a first component, including acrylic monomers and oligomers, capable of polymerising when irradiated by ultra-violet radiation in the presence of photoinitiators,
a second component, including photoinitiators and synergists, and
a third component, including binder resins that are soluble in water or dilute alkali, as well as in non aqueous solvents, such that, after evaporation of the solvent, there remains a resist film having a thickness of between 3 microns and 30 microns and of which said first component constitutes 35% to 75% by weight, said second component constitutes up to 10% by weight and said third component constitutes 10% to 50% by weight;

(c) depositing over said resist film an aqeous suspension of carbon black so that, after evaporation of the water therein, there remains a coating with a thickness of between 0.3 microns and 6 microns and of which the carbon black constitutes 80% to 100% by weight and which includes not more than 10% by weight of binder resins, such coating being a mask coating.

12. The method of claim 11, whereby said resist film has properties that any portion thereof in which said monomers and oligomers have polymerised, such portion being a cured portion, is resistant to metal etching agents and any uncured portions thereof are entirely soluble in water or in dilute aqueous alkali solvents.

13. The method of claim 12, whereby said binder resins have a further property of not preventing cured portions of said resist film from being resistant to aqueous alkali solvents.

14. The method of claim 12, whereby uncured portions of said resist film are also soluble in metal etching agents.

15. The method of claim 11, whereby said resist film has a further property of adsorbing carbon black from aqueous suspensions so as to render said mask coating, formed thereon, rub resistant.

16. The method of claim 11 whereby said mask coating directly adjoins said resist film.

17. The method of claim 11, whereby said resist film has a further property of thermally insulating between said metal foil and said mask coating.

18. The method of claim 11, whereby said mask coating has a property of substantially attenuating ultraviolet radiation and is ablatable by infrared irradiation.

19. The method of claim 18, whereby said resist film has a further property of not allowing diffusion thereto of carbon black from said mask coating in quantities that would interfere with said polymerising.

20. A method for fabricating a printed circuit board (PCB) with a wiring pattern formed thereon according to digitally provided image data, comprising:

(a) providing a blank PCB that includes four layers, the four layers being, in sequence, an insulating substrate, a metal foil, a resist layer and a mask layer, wherein the resist layer is curable by exposure to suitable ultraviolet (UV) radiation and the mask layer substantially attenuates UV radiation and is ablatable by exposure to suitable infrared (IR) radiation;

(b) exposing said mask layer to IR radiation whose intensity varies over the upper surface of said mask layer between a low value and a high value according to the image data, said high value being such as to cause ablation of said mask layer;

(c) exposing said resist layer to a flood of UV radiation, so as to cause the resist layer to cure under all areas that correspond to portions of said mask layer that have been ablated, whereby all portions of the resist layer that lie under unablated portions of the mask layer remain uncured;

(d) washing away all unablated portions of said mask layer and all uncured portions of said resist layer, so as to bare the upper surface of said metal layer in essentially all areas that correspond to uncured portions of the resist layer;

(e) subjecting the PCB to a metal etching agent so as to etch said metal layer away under all areas that have been bared in step (d), whereby essentially all portions of the metal layer that lie under cured portions of said resist layer remain intact.

21. The method of claim 20, whereby said resist layer has a thickness of between 3 microns and 30 microns and includes binder resins that are soluble in water or dilute alkali, as well as in non aqueous solvents, and said mask layer has a thickness of between 0.3 microns and 6 microns and includes not more than 10% by weight of binder resins.

22. The method of claim 21, whereby said resist layer further includes acrylic monomers and oligomers, capable of polymerising when irradiated by ultra-violet radiation in the presence of photoinitiators, such polymerising constituting curing of the resist layer.

23. The method of claim 20, whereby in said PCB said mask layer directly adjoins said resist layer.

24. The method of claim 20, whereby in step (b), said IR radiation emanates from a laser and is formed into one or more beams that sequentially scan said mask layer.

25. The method of claim 20, whereby step (b) further includes providing a vacuum system to collect any debris resulting from said ablation.

26. The method of claim 20, whereby in step (d) said washing away is by means of an aqueous alkaline solution.

27. The method of claim 20, whereby step (d) is carried out concurrently with step (e) and said washing away is by means of said etching agent.

* * * * *